United States Patent
Takahashi (10) Patent No.: US 8,957,492 B2
(45) Date of Patent: Feb. 17, 2015

(54) SEMICONDUCTOR DEVICE HAVING GROOVES ON A SIDE SURFACE AND METHOD OF MANUFACTURING THE SAME

(75) Inventor: Akihiro Takahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 13/418,528

(22) Filed: Mar. 13, 2012

(65) Prior Publication Data

US 2013/0056859 A1 Mar. 7, 2013

(30) Foreign Application Priority Data

Sep. 5, 2011 (JP) .................... 2011-192307

(51) Int. Cl.
*H01L 27/146* (2006.01)
*H01L 21/00* (2006.01)
*H01L 21/78* (2006.01)
*H01L 23/28* (2006.01)

(52) U.S. Cl.
CPC ............... *H01L 21/78* (2013.01); *H01L 23/28* (2013.01)
USPC .......................................... 257/443; 438/113

(58) Field of Classification Search
USPC .......... 257/667–671, 687, 701, 702, E21.599, 257/E23.116; 438/106–127, 612–617
See application file for complete search history.

(56) References Cited

U.S. PATENT DOCUMENTS

| | | | |
|---|---|---|---|
| 2009/0020882 A1* | 1/2009 | Hasegawa | 257/773 |
| 2009/0148999 A1* | 6/2009 | Gogoi | 438/425 |
| 2009/0206442 A1* | 8/2009 | Divakaruni et al. | 257/506 |
| 2010/0027294 A1* | 2/2010 | Lee et al. | 362/620 |
| 2010/0273308 A1* | 10/2010 | Gogoi et al. | 438/422 |
| 2011/0095289 A1* | 4/2011 | Sasaki et al. | 257/48 |
| 2011/0262681 A1* | 10/2011 | Nishiguchi et al. | 428/78 |

FOREIGN PATENT DOCUMENTS

| | | |
|---|---|---|
| JP | 2002-299372 A | 10/2002 |
| JP | 2007-273993 | 10/2007 |

OTHER PUBLICATIONS

Office Action issued Feb. 12, 2014, in Japanese Patent Application No. 2011-192307 with English translation.

\* cited by examiner

*Primary Examiner* — Chuong A Luu
*Assistant Examiner* — Moin Rahman
(74) *Attorney, Agent, or Firm* — Oblon, Spivak, McClelland, Maier & Neustadt, L.L.P.

(57) ABSTRACT

In one embodiment of a method of manufacturing a semiconductor device, a plurality of substantially columnar trenches are formed along a region for forming a dicing line in a semiconductor substrate having first surface and second surfaces opposed to each other, from the first surface. The substrate is subjected to a heat treatment. At least one hollow portion is formed in the substrate by migration of a material which composes the substrate. Semiconductor devices are formed in semiconductor regions of the substrate which are surrounded by the region for forming the dicing line. The semiconductor regions are provided on a side of the first surface. A portion of the substrate is removed from a side of the second surface until the thickness is reduced to a predetermined value. The substrate is divided into chips along a dicing line from at least the one hollow portion as a starting point.

5 Claims, 10 Drawing Sheets

SEMICONDUCTOR DEVICE HAVING GROOVES ON A SIDE SURFACE AND METHOD OF MANUFACTURING THE SAME

CROSS-REFERENCE TO RELATED APPLICATION(S))

This application is based upon and claims the benefit of priority from the prior Japanese Patent Application No. 2011-192307, filed on Sep. 5, 2011, the entire contents of which are incorporated herein by reference.

FIELD

Embodiments described herein relate generally to a semiconductor device and a method of manufacturing a semiconductor device.

BACKGROUND

In a manufacturing process of semiconductor devices, a semiconductor element is formed in each rectangular region of a semiconductor substrate which is surrounded by regions for forming dicing lines. Then, the semiconductor substrate is divided into chips along dicing lines.

Broadly speaking, two methods, i.e., a blade dicing and a laser dicing are known as a method for dividing a semiconductor substrate into chips.

According to the blade dicing, a semiconductor substrate is mechanically cut using a diamond blade. The blade dicing has a problem that chipping may occur inevitably. The blade dicing has another problem that a margin is required for a distance between a blade and a chip end so that a width of a dicing line may be increased.

In a method of laser dicing, a surface of a semiconductor substrate is irradiated with laser light, and a groove is formed on the surface of the semiconductor substrate by ablation. Then, the semiconductor substrate is separated into chips by breaking from the groove as a starting point. In another method of laser dicing, an interior of a semiconductor substrate is irradiated with laser light, and a modified layer is formed in the semiconductor substrate. Then, the semiconductor substrate is separated into chips by breaking from the modified layer.

According to the laser dicing, a width of a dicing line can be reduced as compared with the blade dicing.

In any one of the methods, however, a distortion caused at the time of dividing remains in a side surface portion of a divided chip. Hence, a stress of resin to be molded can occur so that reliability of a chip-state semiconductor device may be deteriorated. In order to avoid the problem, it is necessary to add a process to remove a distortion remained in the side surface portion of the divided chip.

DETAILED DESCRIPTION

According to one embodiment, a method of manufacturing a semiconductor device is provided. In the method, a plurality of substantially columnar trenches are formed along a region for forming a dicing line in a semiconductor substrate having first surface and second surfaces opposed to each other, from the first surface. The semiconductor substrate is subjected to a heat treatment. At least one hollow portion is formed in the semiconductor substrate by migration of a material which composes the semiconductor substrate.

Semiconductor devices are formed in semiconductor regions of the semiconductor substrate which are surrounded by the region for forming the dicing line. The semiconductor regions are provided on a side of the first surface. A portion of the semiconductor substrate on which the semiconductor devices are formed is removed from a side of the second surface until the thickness of the semiconductor substrate is reduced to a predetermined value. The semiconductor substrate on which the semiconductor devices are formed is divided into chips along a dicing line from at least the one hollow portion as a starting point.

Hereinafter, further embodiments will be described with reference to the drawings.

In the drawings, the same reference numerals denote the same or similar portions respectively.

A method for manufacturing a wafer-state semiconductor device according to a first embodiment and a chip-state semiconductor device according to an embodiment will be described with reference to FIGS. 1A to 1C, 2, 3A to 3K and 4 to 6.

Figure 1A:
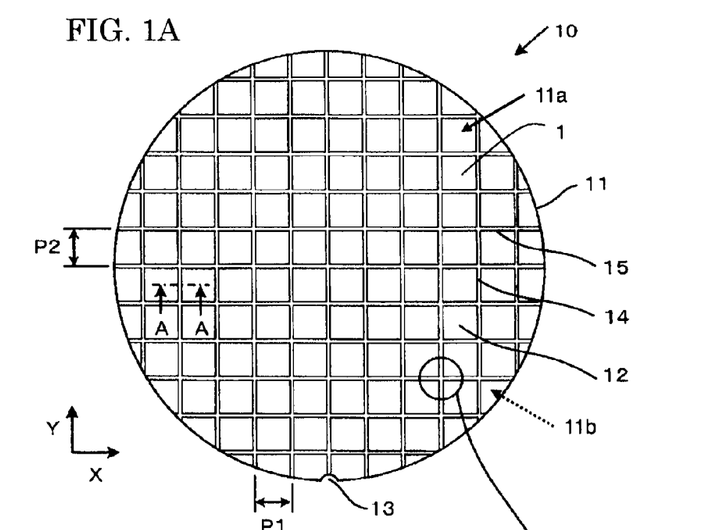
FIG. 1A is a plan view showing a wafer-state semiconductor device.
Figure 1B:
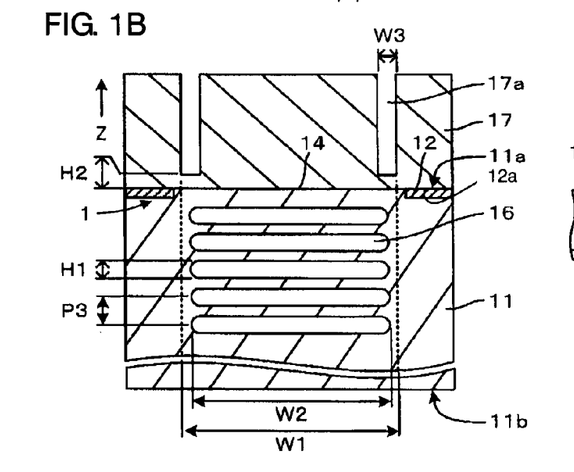
FIG. 1B is a partially enlarged sectional view of the wafer-state semiconductor device.
Figure 1C:
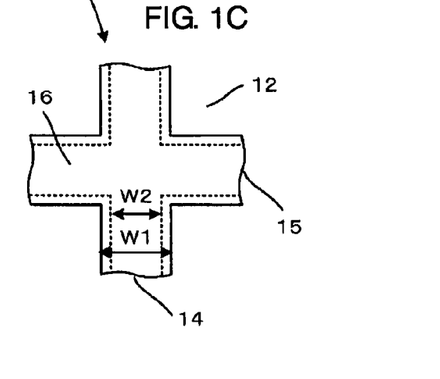
FIG. 1C is a partially enlarged plan view of the wafer-state semiconductor device.

FIG. 1A is a plan view showing the wafer-state semiconductor device. FIG. 1B is an enlarged sectional view taken along A-A line in FIG. 1A. FIG. 1C is a partially enlarged plan view of FIG. 1A.

FIGS. 2, 3A to 3K, 4 and 5 are enlarged sectional views showing steps of the method of manufacturing the wafer-state semiconductor device. FIG. 6 is a sectional view showing a semiconductor chip which is a semiconductor device according to an embodiment obtained by dividing the wafer-state semiconductor device.

As shown in FIG. 1A, a semiconductor substrate 11 composing a wafer-state semiconductor device 10 is a substrate (wafer) of silicon having first and second surfaces 11a, 11b opposed to each other. The semiconductor substrate 11 is N-conductivity type. The plane orientation of the semiconductor substrate 11 is (100). The diameter of the semiconductor substrate 11 is 200 mm.

In rectangular semiconductor regions 1 of the semiconductor substrate 11, semiconductor devices 12 are formed respectively. The semiconductor devices 12 are an integrated circuit (LSI) having a size of a few millimeters, for example. The semiconductor devices 12 become chips in a subsequent manufacturing process. As shown in FIG. 1B, Circuit elements which compose the semiconductor devices 12 are formed in surface portions 12a of the semiconductor regions 1 on the first surface 11a.

In FIG. 1A, the semiconductor devices 12 are arranged with a pitch P1 in a direction X which intersects at right angles with a notching direction of a notch 13. Further, the semiconductor devices 12 are arranged with a pitch P2 in a direction Y which intersects at right angles with the direction X. Dicing line regions 14 are provided with a pitch P1 in the direction X and between semiconductor devices 12 which are arranged adjacent to each other in the direction X. The dicing line regions 14 are regions where dicing lines are to be formed. Similarly, dicing line regions 15 are provided with a pitch P2 in the direction Y and between semiconductor devices 12 which are arranged adjacent to each other in the direction Y. The dicing line regions 15 are regions where dicing lines are to be formed.

The dicing line regions 14 and 15 have a width W1, and are provided on the first surface 11a of the semiconductor substrate 11 in a form of lattice. The semiconductor devices 12 are respectively provided in the rectangular semiconductor regions 1 surrounded by the dicing line regions 14 and 15.

The directions X and Y are respectively perpendicular to a (01-1) plane and a (011) plane which are cleavage surfaces of silicon.

As shown in FIG. 1B, a plurality of hollow portions 16 are provided in the semiconductor substrate 11 which corresponds to the dicing line regions 14 and 15 of the semiconductor substrate 11. The hollow portions 16 have a thickness H1 and a width W2, and provide a space shape which is similar to a space shape between parallel and flat plates. The hollow portions 16 extend along the dicing line regions 14 and 15 in the directions X and Y and in parallel to the first surface 11a of the semiconductor substrate 11.

The hollow portions 16 are arranged with a pitch P3 such that they are separated from one another in a direction Z which is perpendicular to the first surface 11a of the semiconductor substrate 11. In FIG. 1B, five hollow portions 16 are shown as an example.

In FIG. 1B, broken lines show boundaries between one of the dicing line regions 14 and the semiconductor regions 1 i.e. the semiconductor devices 12. In FIG. 1C, broken lines show edges of the hollow portions 16.

A protection film 17 is insulating, and is provided on the first surface 11a of the semiconductor substrate 11. The protection film 17 covers the semiconductor devices 12. Wiring layers (not shown) are provided in a portion above the semiconductor devices 12. An insulation film (not shown) is provided between the wiring layers in order to fill spaces between the wiring layers to flatten a surface. The insulation film is included in the protection film 17. The protection film 17 indicates the entire insulation film provided in an upward direction from the first surface 11a of the semiconductor substrate 11.

The protection film 17 has slits 17a along the dicing line regions 14 and 15. The slits 17a are provided on both sides of the dicing line regions 14 and 15 such that the slits 17a oppose to the edges of the hollow portions 16.

In FIG. 1B, the width W1 of the dicing line regions 14 and 15 are about 30 µm, for example. The width W2 of each of the hollow portions 16 is about 20 µm. The height H1 of each of the hollow portions 16 is about 1 µm, for example. The pitch P3 of each of the hollow portions 16 is about 2.37 µm, for example.

The protection film 17 is a laminated film including a silicon oxide film and a silicon nitride film, and the total thickness of the protection film 17 is about 4.5 µm. The Width W3 of the slits 17a is about 3 µm, for example. The remaining thickness H2 of the protection film 17 under the slits 17a is about 50 nm, for example. In FIG. 1B, the remaining thickness H2 is expressed as enlarged in an up and down direction by using lead lines, for explanation convenience.

In the wafer-state semiconductor device 10 of the example shown in FIGS. 1A to 1C, an adhesive sheet (described below) is attached onto the protection film 17. When the adhesive sheet is expanded, portions of the wafer-state semiconductor substrate 11 sandwiched between the hollow portions 16 are ruptured from the slits 17a as starting points, and the wafer-state semiconductor substrate 11 is divided into a plurality of chips.

By the expansion, the adhesive sheet is stretched in all direction within an X-Y plane. A tensile stress occurs in the semiconductor substrate 11 attached onto the adhesive sheet. This tensile stress centers on a portion having a small cross-sectional area. In the protection film 17, a stress centers on bottoms of the slits 17a. In the semiconductor substrate 11, a stress centers mainly on a portion sandwiched between the hollow portions 16.

As a result, when the tensile stress becomes larger than yield stresses of the silicon oxide film and silicon, the bottoms of the slits 17a become starting points of rupture, and the wafer-state semiconductor substrate 11 is ruptured along a cleavage surface from a portion of the semiconductor substrate 11 sandwiched between ones of the hollow portions 16 close to the slits 17a. By the rupture, the semiconductor substrate 11 is divided into chips, and chip-state semiconductor devices of an embodiment which will be described in detail below are obtained.

Since the ruptured surface is a cleavage surface, a side surface of the chip is substantially smooth, and a distortion produced when the semiconductor substrate 11 is divided into chips may not remain in principle. Accordingly, it is possible to obtain a semiconductor device having less residual distortion when the semiconductor substrate 11 is divided.

A method of manufacturing the wafer-state semiconductor device 10 will be described below. In the method, a phenomenon that a hollow structure is formed in a silicon substrate by surface migration of silicon caused by a heat treatment is applied. The hollow portions 16 shown in FIGS. 1B and 1C can be formed by the phenomenon. In the method, after substantially columnar trenches are formed in a semiconductor substrate 11, the semiconductor substrate 11 is subjected to a heat treatment, and hollow portions 16 are formed.

The phenomenon that a hollow structure is formed in a silicon by surface migration of the silicon caused by a heat treatment is known.

When a columnar trench having a radius Ra and a depth L is formed in a substrate of silicon for example, a spherical hollow portion having a radius Rs (=1.88 Ra) is formed in accordance with a radius Ra of the trench, and a plurality of hollow portions are formed with a pitch λ (=8.89 Ra) in accordance with the depth L.

When trenches having a radius Ra are arranged with a pitch Rs or less in a form of lattice, adjacent spherical hollow portions having a radius Rs are united with each other, and a plate-shaped hollow portion having a height 2Rs is formed.

A method shown in FIGS. 3A to 3I may be used to form hollow portions as described below.

Figure 2:
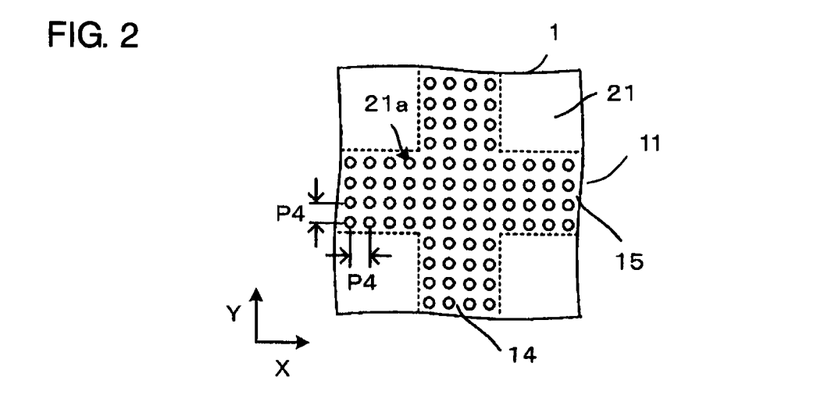
FIG. 2 is a partially enlarged plan view of a wafer-state semiconductor device which shows a step of a method of manufacturing a semiconductor device according to a first embodiment.

FIG. 2 is a partially enlarged plan view of a semiconductor device. FIGS. 3A to 3I are partially enlarged sectional views of a semiconductor substrate 11. Broken lines which are shown in FIG. 2 show boundaries between dicing line regions 14, 15 and semiconductor regions 1 for forming semiconductor devices 12.

Figure 3A:
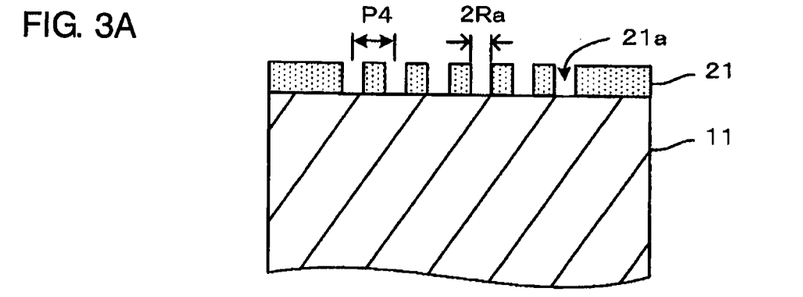
FIGS. 3A to 3K are enlarged sectional views of the wafer-state semiconductor device which show respective steps of the method of manufacturing the semiconductor device according to the first embodiment.

As shown in FIGS. 2 and 3A, a mask material 21 having a plurality of circular openings 21a is formed on the dicing line regions 14, 15 of a semiconductor substrate 11 having a thickness of about 800 μm initially.

The mask material 21 is a resist film formed on the semiconductor substrate 11 via a silicon oxide film (not shown). The openings 21a are formed by patterning the resist film by photolithography. The openings 21a have a radius Ra and are arranged with a pitch P4 in the directions X and Y in a form of lattice.

In order to obtain a height H1 (=1 μm) for each hollow portion 16 shown in FIG. 1B, the radius Ra for the openings 21a are set to about 0.27 μm in accordance with the relation described above. The pitch P4 shown in FIG. 2 is set to the same value as the height H1 shown in FIG. 1B.

Figure 3B:
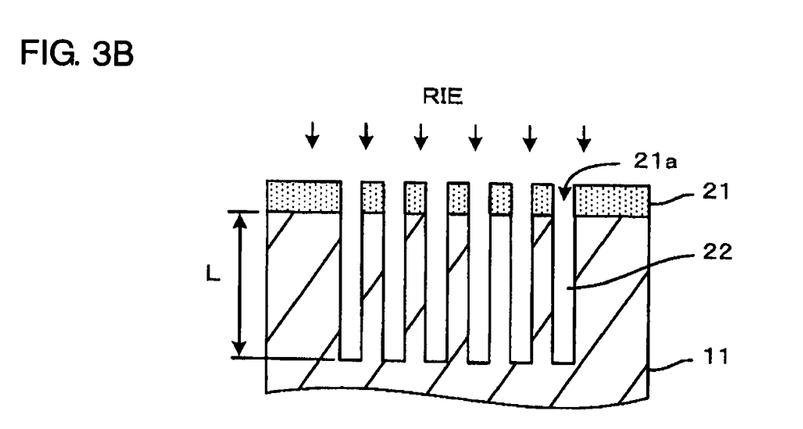

Then, columnar trenches 22 having a depth L are formed by an RIE (Reactive Ion Etching) using a fluorine-based gas atmosphere and using the mask material 21, as shown in FIG. 3B. An aspect ratio of the trenches 22 are expressed by L/2Ra. According to the relation described above, about 20 is required as the aspect ratio to obtain five hollow portions 16 shown in FIG. 3I.

The mask material 21 is removed using an asher, and, then, the semiconductor substrate 11 is subjected to a heat treatment in a reducing atmosphere. A heat treatment condition is following. The atmosphere is a hydrogen atmosphere having a pressure of about 1,333 Pa (10 Torr). The temperature is about 1,100° C. The heating time period is about 10 minutes.

Surface migration of silicon occurs by the heat treatment, and hollow portions 16 are formed in the semiconductor substrate 11. A manner in which a plurality of hollow portions 16 is formed will be described in detail using FIGS. 3C to 3I.

Figure 3C:
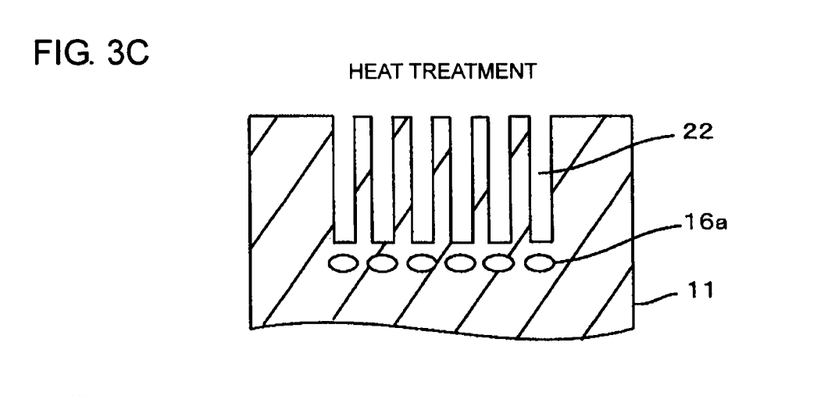

As shown in FIG. 3C, surface migration of silicon caused by the heat treatment starts from portions having a smallest radius of curvature. In the case of the trenches 22 formed in the semiconductor substrate 11, since corners of bottoms of the trenches 22 have small radii of curvature, the trenches 22 start deforming such that the radii of curvature of corner portions become large.

The corners of the bottoms of the trenches 22 are increased, and flowing silicon atoms gather at portions slightly above the bottoms so that diameters of the trenches 22 are reduced. As a result, the trenches 22 are closed, and spherical cavities 16a are formed. Accordingly, the trenches 22 become shallower. In FIGS. 3C to 3H, the cavities 16a may look like a spheroid, but the cavities 16a are nearly spherical, actually. Other cavities described below also have the same shape as the cavities 16a.

Figure 3D:
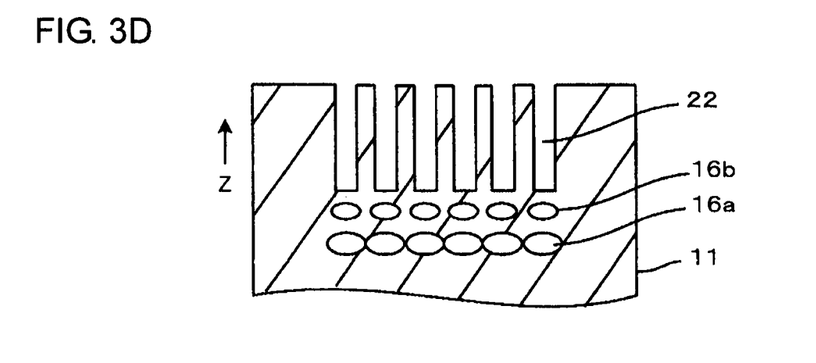

As shown in FIG. 3D, the diameters of the spherical cavities 16a formed in lower portions of the trenches 22 become larger than the diameters of the trenches 22 shown in FIG. 3C.

In the state, since the spherical cavities 16a are arranged in a form of lattice and brought closer to one another than the trenches 22 so that the spherical cavities 16a are connected to one another in due course.

Since aspect ratios of the trenches 22 are as large as 20, once the spherical cavities 16a are formed, spheroidizing is again started from the bottoms of the trenches 22 similarly. As a result, cavities 16b are newly formed, and the cavities 16a and the cavities 16b line up in the direction Z.

Figure 3E:
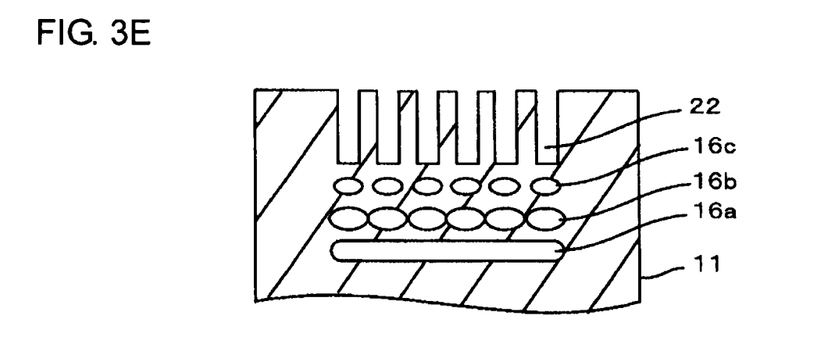

Then, the connected spherical cavities 16a form a flat plate-shaped hollow portion as shown in FIG. 3E. The spherical cavities 16b are connected to one another, and spherical cavities 16c are newly formed. With the formation, the trenches 22 become further shallower. At this stage, one flat plate-shaped hollow portion is obtained.

Figure 3F:
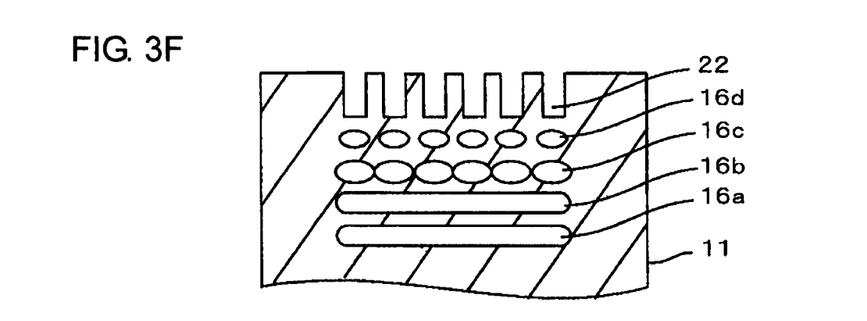

As shown in FIG. 3F, a surface migration of silicon which is similar to that described above is repeated, the connected spherical cavities 16b form another flat plate-shaped hollow portion. The spherical cavities 16c are connected to one another, and spherical cavities 16d are newly formed. With the formation, the trenches 22 further become shallower. At this stage, two hollow portions are obtained.

Figure 3G:
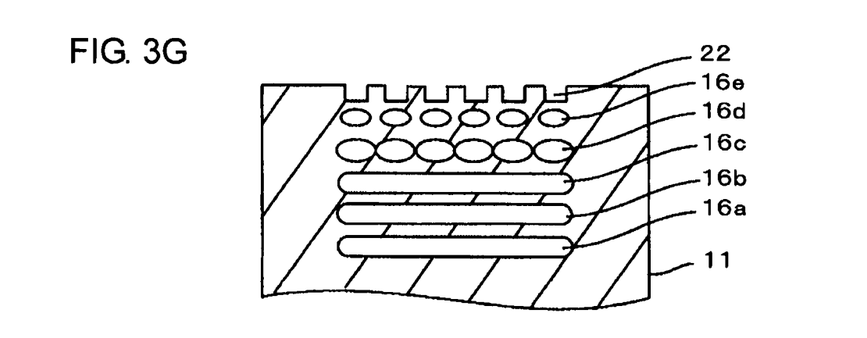

As shown in FIG. 3G, a process which is similar to that described above is repeated, and the connected spherical cavities 16c form another flat plate-shaped hollow portion. The spherical cavities 16d are connected to one another, and spherical cavities 16e are newly formed. With the formation, the trenches 22 further become shallower. At this stage, three hollow portions are obtained.

Figure 3H:
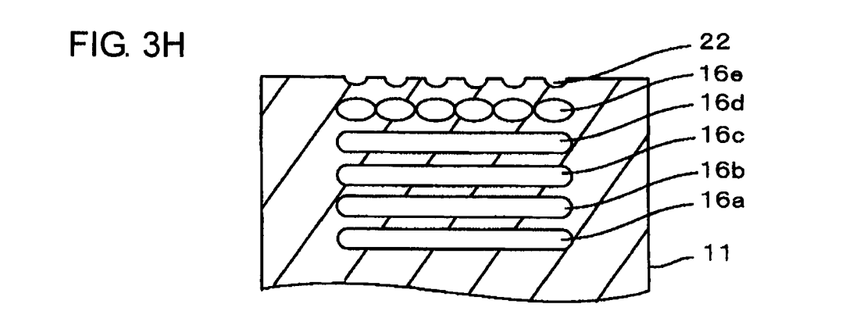

As shown in FIG. 3H, a process which is similar to that described above is repeated, the connected spherical cavities 16d further form another flat plate-shaped hollow portion, and spherical cavities 16e are connected to one another. However, since the trenches 22 are too shallow, further spherical cavities are not formed. At this stage, four hollow portions are obtained.

Figure 3I:
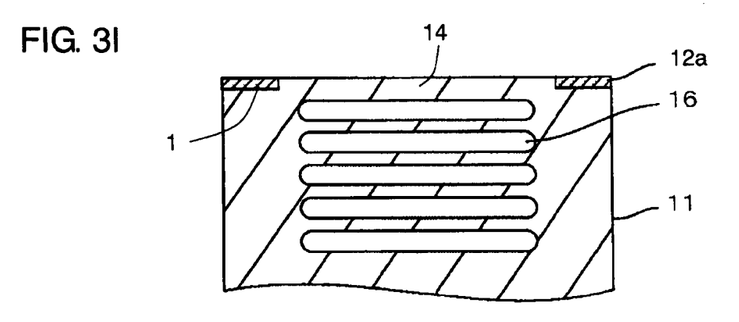

As shown in FIG. 3I, the spherical cavities 16e further form another flat plate-shaped hollow portion. At this stage, five hollow portions are obtained. The openings of the trenches 22 are closed, and a flat surface is eventually formed. In this manner, hollow portions which are similar to the hollow portions 16 shown in FIG. 1B are formed in the direction Z in the semiconductor substrate 11.

Then, circuit elements which compose each semiconductor device 12 are formed in a surface portion 12a of each rectangular semiconductor region 1 surrounded by the dicing line regions 14, 15, by a well known manufacturing method.

Figure 3J:
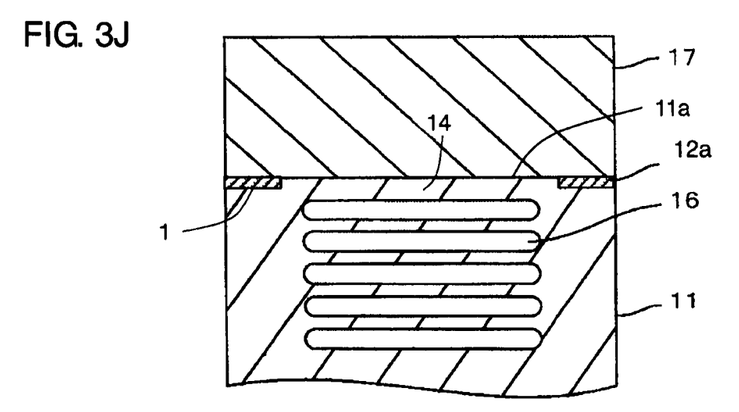

As shown in FIG. 3J, a protection film 17, for example, a silicon oxide film having a thickness of 4.5 μm is formed on a first surface 11a of the wafer-state semiconductor substrate 11 in which the semiconductor devices 12 are formed, by a CVD (Chemical Vapor Deposition) method.

Figure 3K:
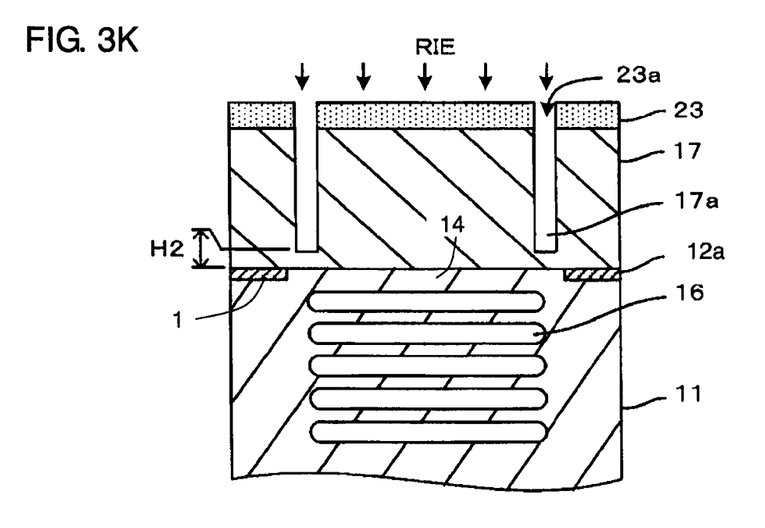

As shown in FIG. 3K, a resist film 23 having openings at both sides of the dicing line regions 14, 15 is formed on the protection film 17. The openings correspond to edges of the hollow portions 16. The protection film 17 is anisotropically etched by a RIE method using fluorine-based gas and using the resist film 23 as a mask so that slits 17a are formed.

Stresses center on the bottoms of the slits 17a, and the slits 17a serve as starting points for rupturing the semiconductor substrate 11. Accordingly, a thickness H2 of remaining portions of the protection film 17 below the bottoms is small desirably.

Figure 4:
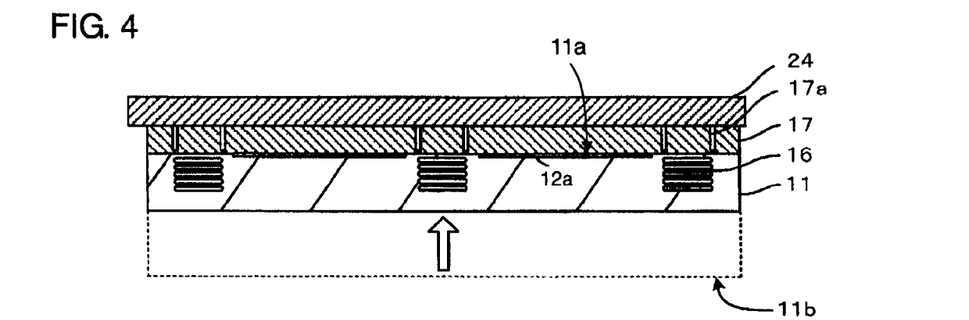
FIG. 4 is a partially enlarged sectional view of the wafer-state semiconductor device which shows a step of the method of manufacturing the semiconductor device.

Then, as shown in FIG. 4, an adhesive protection sheet 24 is attached onto the semiconductor substrate 11 to protect a surface of the semiconductor substrate 11. The semiconductor substrate 11 is ground from a second surface 11b of the substrate 11 and is thinned to 50 μm thickness, by a grinder.

The second surface 11b of the semiconductor substrate 11 may be flattened by a CMP (Chemical Mechanical Polishing) to remove damage resulting from the grinding operation by the grinder.

Figure 5:
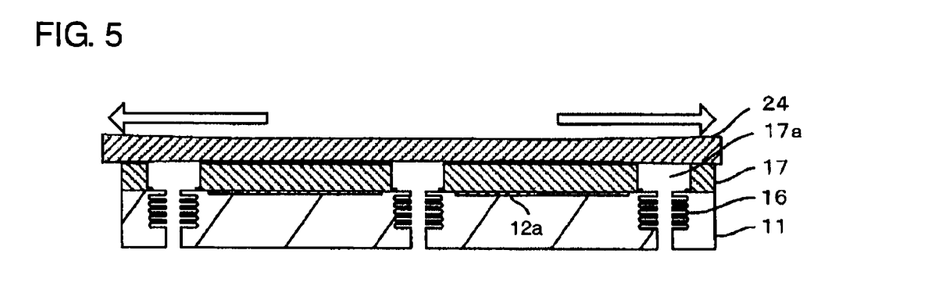
FIG. 5 is a partially enlarged sectional view of the wafer-state semiconductor device which shows a step of the method of manufacturing the semiconductor device.
Figure 6:
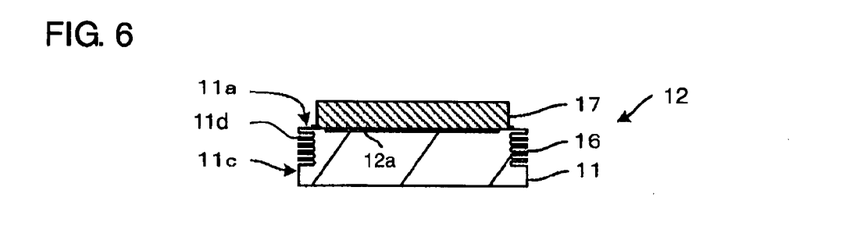
FIG. 6 is a sectional view showing a semiconductor chip which is a semiconductor device of an embodiment obtained by dividing the wafer-state semiconductor device.

As shown in FIG. 5, the protection sheet 24 is expanded to stretch the sheet 24 in all lateral directions substantially. The semiconductor substrate 11 is cleaved from the bottoms of the slits 17a of the protection film 17 as starting points, by a tensile stress at that time. As a result, as shown in FIG. 6, a chip-state semiconductor device 12 is obtained, as an embodiment.

Each side surface 11c of the chip (the semiconductor device 12) which intersects with the first and second surfaces 11a, 11b at right angles substantially is provided with a plurality of grooves 11d arranged at regular intervals from the first surface 11a toward the second surface 11b. The grooves 11d are produced by dividing the flat plate-shaped hollow portions 16. Flat plate-shaped recesses formed by the grooves 11d extend in a direction which is parallel to the first surface 11a of semiconductor substrate 11.

The circuit elements composing the semiconductor devices 12 are formed in surface portions 12a of the chip which does not overlap on the grooves 11d. The protection film 17 is provided on the first surface 11a of the semiconductor substrate 11 such that the protection film 17 covers the semiconductor device 12.

As described above, according to the manufacturing method, the flat plate-shaped hollow portions 16 are formed in the semiconductor substrate 11 so as to correspond with the dicing line regions 14, 15 of the semiconductor substrate 11. The slits 17a are formed along the dicing line regions 14, 15 in the protection film 17 formed on the semiconductor substrate 11.

As a result, it is possible to cleave the semiconductor substrate 11 from the bottoms 16 of the slits 17a as starting points via a portion of the semiconductor substrate 11 where the hollow portions 16 exist. The semiconductor substrate 11 is divided into a plurality of chips along dicing lines which correspond to the dicing line regions 13, 15. The manufacturing method can suppress residual distortion of which occurs when the semiconductor substrate 11 are divided into chips. Thus, the semiconductor devices 12 may be a reliable chip-state semiconductor device.

In the above description, the case where the protection sheet 24 is expanded to divide the semiconductor substrate 11 into chips is explained. Alternatively, it is also possible to use breaking in dividing a semiconductor substrate into chips.

In the above description, the case where the slits 17a are formed in the protection film 17 is explained. Alternatively, it is also possible to divide the semiconductor substrate 11 into chips without using slits 17a because the hollow portions 16 exist. In this case, breaking is more suitable for using than expansion.

In the above description, the case where the five hollow portions 16 of the flat plate-shape are formed in the direction perpendicular to the first surface 11a of the semiconductor substrate 11 is explained. The number of hollow portions is not limited to five.

The number of the hollow portions 16 may appropriately be increased or decreased in accordance with the thickness of the semiconductor substrate at the time of dicing. The number of the hollow portions 16 is increased when the semiconductor substrate is thick, and the number of the hollow portions 16 is decreased when the semiconductor substrate is thin. The aspect ratio of the columnar trenches 22 may be increased or decreased in accordance with increase or decrease of the number of hollow portions.

Since dicing lines corresponding to the dicing line regions 14, 15 become flat surfaces substantially, eventually, it is possible to form a semiconductor element on the dicing lines. A MOS transistor for evaluating process is suitable to form on the dicing lines, as the semiconductor element.

The radius Ra, the depth L and the pitch P4, which are parameters for forming the hollow portions 16, are not limited to the values described above, and these parameters can be changed in accordance with a purpose.

The projections and depressions formed based on the hollow portions 16 of semiconductor, i.e., the grooves 11d arranged at regular intervals remain on the side surfaces of the semiconductor devices 12 of chips. When the chips are molded with resin, the resin adheres onto the projections and depressions so that adhesion can be enhanced. Further, since residual distortion is suppressed at the time of dividing into chips, deterioration of characteristics or reliability of the semiconductor device 12 which is caused by a resin stress may be suppressed.

Figure 7A:
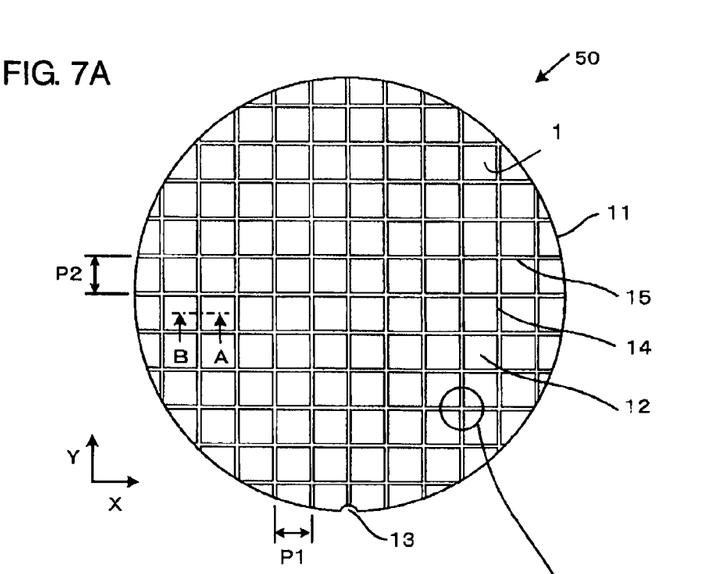
FIG. 7A is a plan view of another wafer-state semiconductor device.
Figure 7B:
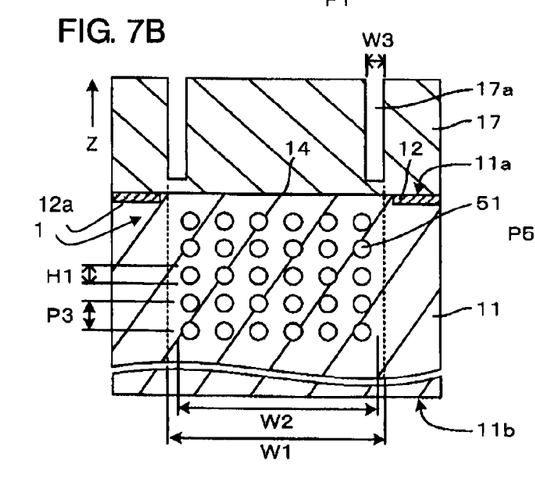
FIG. 7B is a partially enlarged sectional view of the semiconductor device.
Figure 7C:
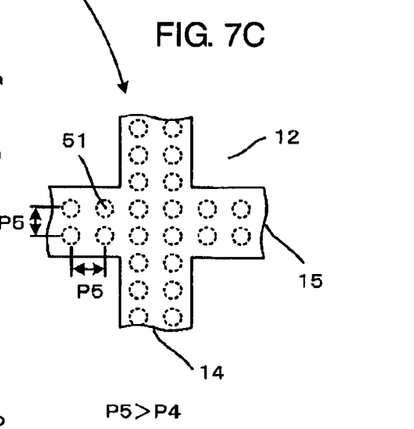
FIG. 7C is a partially enlarged plan view of the semiconductor device.
Figure 8:
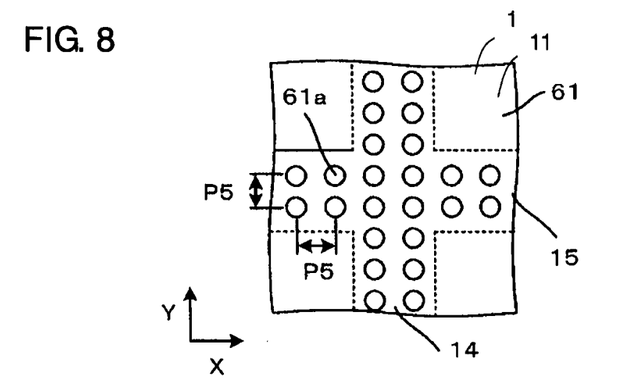
FIG. 8 is a partially enlarged plan view of a wafer-state semiconductor device which shows a step of a method of manufacturing a semiconductor device according to a second embodiment.

A method of manufacturing a wafer-state semiconductor device according to a second embodiment will be described using FIGS. 7A to 7C, 8 and 9A to 9H. FIG. 7A is a plan view of a wafer-state semiconductor device. FIG. 7B is an enlarged sectional view taken along B-B line shown in FIG. 7A and viewed in an arrowed direction. FIG. 7C is a partially enlarged plan view of FIG. 7A. FIG. 8 is a partially enlarged plan view of the wafer-state semiconductor device. FIGS. 9A to 9H are enlarged sectional views showing steps of the method of manufacturing the semiconductor device.

In this embodiment, the shapes of hollow portions are spherical, which are different from the hollow portions 16 formed by the manufacturing method of the first embodiment.

As shown in FIGS. 7A and 7B, in a wafer-state semiconductor device 50, spherical hollow portions 51 are formed in a semiconductor substrate 11 to correspond to dicing line regions 14, 15 of the semiconductor substrate 11. The hollow portions 51 are arranged in a form of three dimensional lattice.

The hollow portions 51 are arranged with a pitch P5 of FIG. 7C in a direction X and a direction Y which are parallel to a main surface of the semiconductor substrate 11. The hollow portions 51 are arranged with a pitch P3 in a direction Z which intersects with the direction X and the direction Y at right angles. The pitch P3 is the same as that of the hollow portions 16 shown in FIG. 1B.

The pitch P5 of the hollow portions 51 is set larger than the pitch P4 shown in FIG. 2. The pitch P5 has a value corresponding to a height H1 of FIG. 7B or higher, e.g., about 2 μm, for example.

The method of manufacturing the wafer-state semiconductor device 50 will be described below. The steps of the method of manufacturing the semiconductor device 50 are basically the same as those of the wafer-state semiconductor device 10, but are different in that the trenches are formed densely in the semiconductor substrate according to the method of manufacturing the semiconductor device 10 and that trenches are formed loosely in a semiconductor substrate according to the method of manufacturing the semiconductor device 50.

Figure 9A:
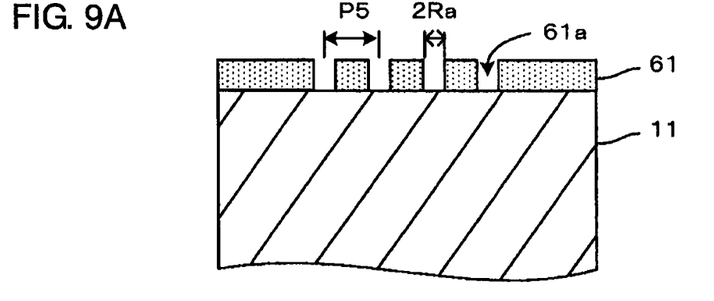
FIGS. 9A to 9H are enlarged sectional views of the wafer-state semiconductor device which show respective steps of the method of manufacturing the semiconductor device according to the second embodiment.

As shown in FIGS. 8 and 9A, similarly to the steps shown in FIGS. 2 and 3A, a mask material 61 having a plurality of circular openings 61a are formed on dicing line regions 14, 15 of the semiconductor substrate 11 in a subsequent process. The openings 61a are arranged with the pitch P5.

Figure 9B:
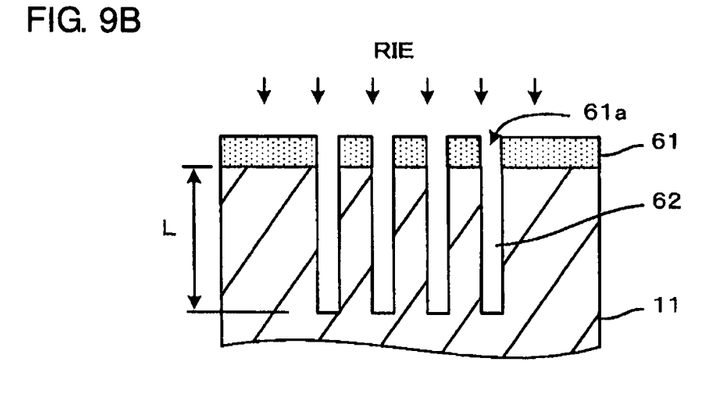
Figure 9C:
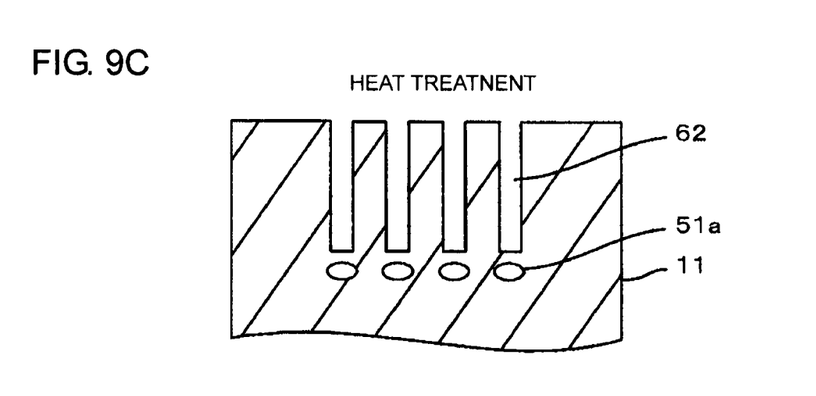
Figure 9D:
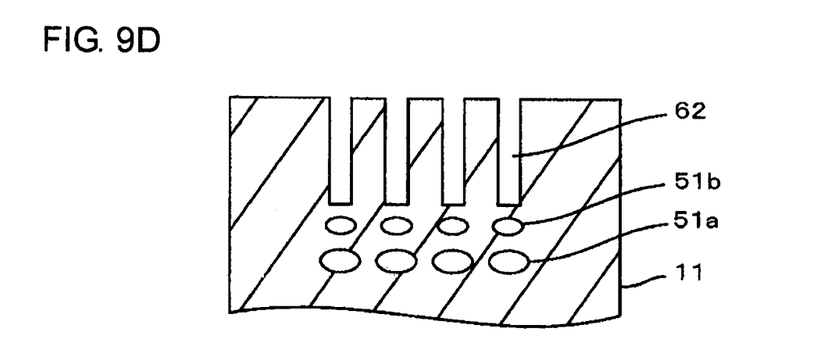
Figure 9E:
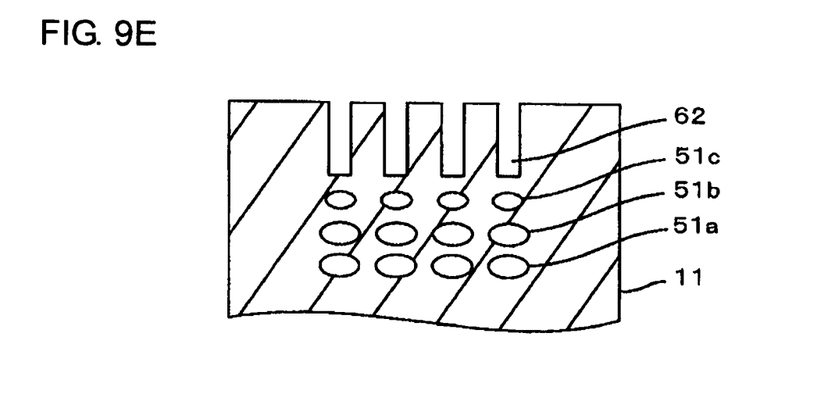
Figure 9F:
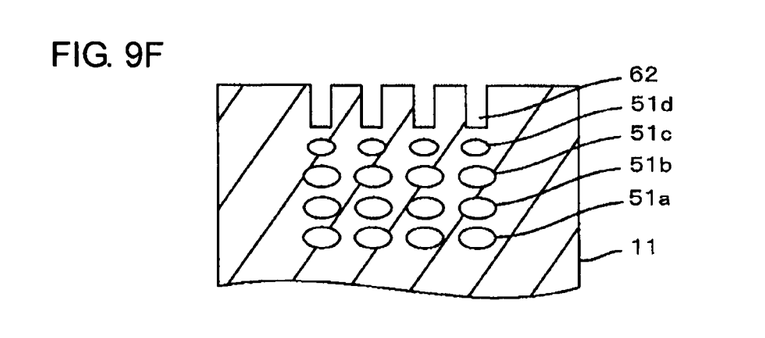
Figure 9G:
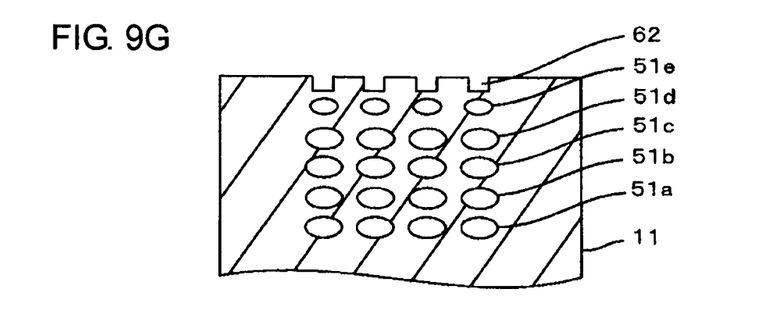
Figure 9H:
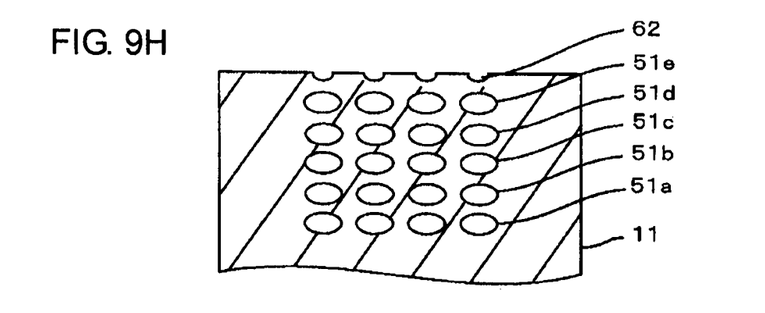

Then, as shown in FIG. 9B, similarly to the step shown in FIG. 3B, trenches 62 having depths L are formed in the semiconductor substrate 11 and, subsequently, the semiconductor substrate 11 is subjected to a heat treatment.

As described in detail below, surface migration of silicon occurs by the heat treatment, and the spherical hollow portions 51 as shown in FIG. 7B are formed in the semiconductor substrate 11. A manner in which the hollow portions 51 are formed are shown in FIGS. 9C to 9H, which is similar to that shown in FIGS. 3C to 3I. As the heat treatment progresses, spherical cavities 51a to 51e are formed in succession as the hollow portions. In FIGS. 9C to 9H, the cavities 51a to 51e may look like a spheroid, but the cavities are nearly spherical, actually.

The second embodiment is different from the first embodiment in that the spherical cavities which are adjacent to each other in the direction X and the direction Y are separated from each other, and the adjacent spherical cavities are not in contact with one another.

By the above steps, the spherical hollow portions 51 are formed in the semiconductor substrate 11 in a form of three dimensional lattice, which correspond to the dicing line regions 14, 15 of the semiconductor substrate 11.

Then, a semiconductor device which is similar to the chip-state semiconductor device shown in FIG. 6 is obtained, in accordance with steps similar to the steps shown in FIGS. 3I to 3K, 4 and 5. A plurality of grooves 11d arranged at regular intervals remains on side surfaces 11c of the obtained chip as shown in FIG. 6.

In this case, the grooves 11d formed by the embodiment are formed by dividing the spherical hollow portions 51. Hemispherical recesses are arranged at regular intervals in a direction parallel to the first surface 11a of the semiconductor substrate 11.

According to the manufacturing method of the embodiment, the spherical hollow portions 51 are arranged in the semiconductor substrate 11 in the form of a three dimensional lattice. The spherical hollow portions 51 can be distributed in the semiconductor substrate 11 more uniformly than the flat plate-shaped hollow portion 16 of the first embodiment. Accordingly, it is possible to suppress deterioration of mechanical strength of the semiconductor substrate 11 due to existence of the hollow portions.

Specifically, in a step of forming the semiconductor device 12 of a chip, it is possible to prevent damage of the semiconductor substrate 11 due to deterioration of a mechanical strength when a thermal stress is applied to the substrate 11 or the substrate 11 is handled. As a result, reliability of the semiconductor device 12 is enhanced.

Further, since the pitch P5 employed in the manufacturing method of the second embodiment is larger than the pitch P4 employed in the manufacturing method of the first embodiment, the number of trenches to be formed can be decreased in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first surface and a second surface opposed to each other, and side surfaces which intersect with the first and second surfaces at right angles substantially, the semiconductor substrate having a plurality of grooves provided on each of the side surfaces, wherein the plurality of grooves are arranged in a direction perpendicular to the first surface;
   an element formed in the semiconductor substrate from the first surface of the semiconductor substrate; and
   a protection film provided on the first surface of the semiconductor substrate to cover the semiconductor element.

2. A semiconductor device according to claim 1, wherein the grooves are arranged at regular intervals substantially.

3. A semiconductor device comprising:
   a semiconductor substrate having first surface and second surface opposed to each other and a side surface which intersects with the first and second surfaces at right angles substantially, the semiconductor substrate having a plurality of grooves provided on the side surface and arranged from the first surface toward the second surface;
   an element formed in the semiconductor substrate from the first surface of the semiconductor substrate; and
   a protection film provided on the first surface of the semiconductor substrate to cover the semiconductor element,
   wherein each of the grooves comprises a plurality of recesses having a flat plate shape substantially, and the recesses extend in a direction parallel to the first surface of the semiconductor substrate.

4. A semiconductor device according to claim 1, wherein each of the grooves comprises a plurality of recesses having a hemispherical shape substantially, and the recesses are arranged in a direction parallel to the first surface of the semiconductor substrate.

5. A semiconductor device according to claim 1, wherein each of the grooves forms a hollow portion.

* * * * *